United States Patent
Yamane (10) Patent No.: US 6,599,135 B2
(45) Date of Patent: Jul. 29, 2003

(54) VEHICLE POWER DISTRIBUTOR AND METHOD OF CONNECTING CONTROL CIRCUIT BOARD TO VEHICLE POWER DISTRIBUTOR

(75) Inventor: Shigeki Yamane, Nagoya (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 210 days.

(21) Appl. No.: 09/905,936

(22) Filed: Jul. 17, 2001

(65) Prior Publication Data
US 2002/0054473 A1 May 9, 2002

(30) Foreign Application Priority Data
Jul. 24, 2000 (JP) ........................................ 2000-222964

(51) Int. Cl.⁷ ................................................. H01R 9/09
(52) U.S. Cl. ........................................ 439/76.2; 439/77
(58) Field of Search ............................... 361/62; 439/65, 439/67, 76.1, 76.2, 77, 78; 307/89

(56) References Cited
U.S. PATENT DOCUMENTS
6,015,302 A    1/2000  Butts et al. ................. 439/76.2
6,033,234 A    3/2000  Wang et al. .................... 439/67
6,464,447 B2 * 10/2002  Dupuy et al. .......... 439/76.2 X

FOREIGN PATENT DOCUMENTS

| EP | 0 901 211 A2 | 3/1999 |
|---|---|---|
| EP | 0 936 847 A1 | 8/1999 |
| JP | 7-31035 A | 1/1995 |
| JP | 8-88925 A | 4/1996 |
| JP | 08 251763 A | 9/1996 |
| JP | 8-251763 A | 9/1996 |
| JP | 8-511674 A | 12/1996 |
| JP | 9-261821 A | 10/1997 |
| JP | 11-18252 A | 1/1999 |

* cited by examiner

Primary Examiner—Jessica Han
(74) Attorney, Agent, or Firm—Oliff & Berridge, PLC (57) ABSTRACT

A power distributor having a power distribution circuit, and a housing 22 in which the power distribution circuit is housed, and a method of connecting a control circuit board 18 to the power distributor. A board support portion 32 for supporting the control circuit board 18 in an erect state is provided in the housing 22. The control circuit board 18 and the power distribution circuit are connected to each other through a wiring material 30 in the condition that the control circuit board 18 is supported by the board support portion 32. Then, the control circuit board 18 is toppled over to thereby be housed in the housing 22.

7 Claims, 5 Drawing Sheets

VEHICLE POWER DISTRIBUTOR AND METHOD OF CONNECTING CONTROL CIRCUIT BOARD TO VEHICLE POWER DISTRIBUTOR

BACKGROUND OF THE INVENTION

1. Technical Field

The present invention relates to a power distributor placed on a vehicle, and a method for connecting a control circuit board to the power distributor, the control circuit board containing a built-in control circuit or the like.

2. Related Art

An electric connect box having fuses and relay switches incorporated in a power distribution circuit constituted by a laminate of a plurality of bus bar boards is generally known as a power distributor for distributing electric power given from an on-vehicle power supply into a plurality of on-vehicle loads. Further, to add a high-level function such as high-speed switching control or the like to the power distributor, a control circuit board having various kinds of electronic circuit devices mounted thereon is connected to the bus bar board and is housed together with the bus bar board in a housing.

As means for connecting the control circuit board to the bus bar board, there is known a method in which tab terminals formed by bending and raising end portions of bus bars are inserted into through-holes provided in a printed circuit board and electrically connected to a circuit of the printed circuit board by soldering or the like. In this method, it is however necessary to punch out a metal plate into a shape inclusive of the tab terminals as the bus bars. Hence, the bus bar area increases correspondingly and, accordingly, the final board area increases to thereby disturb reduction in size. There is also a disadvantage that it is difficult to align the position of each tab terminal with the position of a corresponding board-side through-hole accurately.

Therefore, a technique of connecting a control circuit board to the bus bars through a flexible wiring material such as a flexible printed circuit (FPC) or the like and receiving the control circuit board in a housing while bending the flexible wiring material suitably has been advanced in recent years (for example, see the Unexamined Japanese Patent Application Publication No. Hei8-251763).

3. Problem to be Solved

When the control circuit board is to be connected to the bus bar board, there is needed the step of positioning the control circuit board relative to the bus bar board accurately while holding the control circuit board near the bus bar board by use of a jig or a robot. The step is complex and becomes a big barrier to reduction in cost.

As means for simplifying such a complex step, there is conceived of means of connecting the control circuit board to the bus bar board after fixing the control circuit board to a predetermined receiving position in the housing. Although it is general from the point of view of reduction in total size of the power distributor that the control circuit board is received in the housing in the condition that the control circuit board is toppled over approximately in parallel with the bus bar board, it is, however, very difficult to connect the control circuit board to the bus bar board through the flexible wiring material in the condition that the control circuit board is toppled over.

SUMMARY OF THE INVENTION

The present invention is devised upon such circumstances and an object of the invention is to provide a vehicle power distributor in which a control circuit board can be electrically connected, by a simple step, to a power distribution circuit constituted by conductor plates such as bus bars or the like, and to provide a method of connecting a control circuit board to the power distributor.

Means for Solving the Problem

As mean for solving the problem, according to the present invention, there is provided a vehicle power distributor comprising a power distribution circuit constituted by conductor plates, and a housing for receiving the power distribution circuit, the housing having a space secured for receiving a control circuit board connected to the power distribution circuit in a state in which the control circuit board is toppled over approximately in parallel with the conductor plates, wherein a board support portion for supporting the control circuit board in an erect posture with respect to the conductor plates is provided near the conductor plates so that the control circuit board can be connected to the conductor plates through a flexible wiring material in a condition that the control circuit board is supported by the board support portion (Aspect 1).

Further, according to the present invention, there is provided a method of connecting a control circuit board to a vehicle power distributor having a power distribution circuit constituted by conductor plates, and a housing for receiving the power distribution circuit, the housing having a space secured for receiving a control circuit board connected to the power distribution circuit in a state in which the control circuit board is toppled over approximately in parallel with the conductor plates, the method comprising the steps of: connecting the control circuit board to the conductor plates through a flexible wiring material in a state where the control circuit board is supported in an erect posture by aboard support portion which is provided near the conductor plates for supporting the control circuit board in an erect posture with respect to the conductor plates; and toppling over the control circuit board to thereby receive the control circuit board in the housing (Aspect 6).

According to the aforementioned power distributor and connecting method, the control circuit board is supported in an erect state by the board support portion provided near the conductor plates in advance. Hence, the control circuit board can be easily connected to the conductor plates through a flexible wiring material without using a robot, a jig, or the like to hold the control circuit board. When the control circuit board is toppled over after the connection, the control circuit board can be received in the housing without any inconvenience.

As for a specific structure of the power distributor, when, for example, the housing is molded from an electrically insulating material around the conductor plates, the total structure of the power distributor can be simplified and the number of parts can be reduced greatly. Moreover, in this case, when configuration is made so that the board support portion is formed to be integrated with the housing, the control circuit board can be supported without increasing the number of parts (Aspect 2).

Further, as a specific structure for the board support portion, if there is provided a structure in which the board support portion has support members provided near a side wall of the housing so as to be erected, and in which an insertion space is formed between the side wall of the housing and each of the support members so that a lower end portion of the control circuit board in an erect state can be inserted into the insertion spaces (Aspect 3), the control circuit board can be supported by a simple structure using the side wall of the housing effectively.

Any structure may be used for the board support portion so long as the board support portion can support the control circuit board at least in an erect state. If the board support portion supports the control circuit board so that the control circuit board is rotatable between an erect position in which the control circuit board is erected with respect to the conductor plates and a toppled position in which the control circuit board is toppled over approximately in parallel with the conductor plates, the board support portion is more preferred (Aspect 4). In this configuration, after the control circuit board is connected to the conductor plates through the flexible wiring material in the condition that the control circuit board is supported in the erect posture by the board support portion, the control circuit board can be toppled over and received in the housing while making the control circuit board supported by the board support portion (in other words, without removing the control circuit board from the board support portion) (Aspect 7). Hence, working efficiency is improved more greatly.

For example, a structure for supporting axial portions protruded at left and right ends of the lower end portion of the control circuit board so that the control circuit board is rotatable around the axial portions is preferably used for the board support portion (Aspect 5).

DETAILED DESCRIPTION OF THE PREFERRED EMBODIMENTS

Mode for Carrying Out the Invention

A preferred embodiment of the present invention will be described with reference to the drawings.

Figure 1:
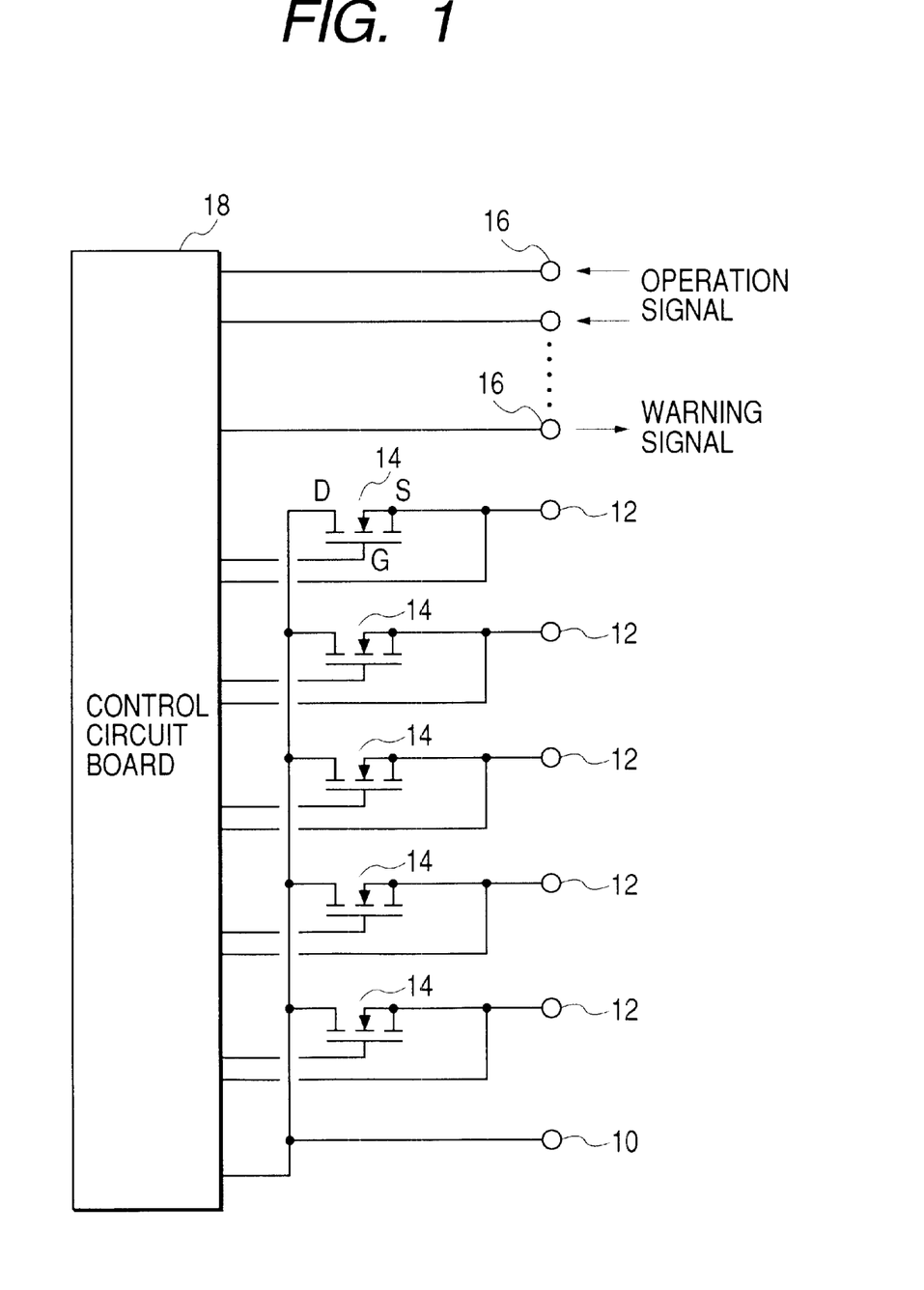
FIG. 1 is a circuit diagram of a vehicle power distributor according to an embodiment of the present invention.

Referring to FIG. 1, first, the circuit configuration of a vehicle power distributor according to this embodiment will be described.

This power distributor has an input terminal 10 connected to a battery, and a plurality of (for example, five in FIG. 1) output terminals 12. A semiconductor switching device (power MOSFET 14 illustrated in FIG. 1, hereinafter referred to as "FET") is interposed between the input terminal 10 and each of the output terminals 12. Specifically, an input side current-conduction terminal (drain) of each FET 14 is connected to the common input terminal 10 and an output side current-conduction terminal (source) of each FET 14 is connected to corresponding one of the output terminals 12.

A control circuit board 18 is further connected to the aforementioned power distribution circuit to thereby add a high-grade control function to the power distributor. Specifically, connection is made so that all the current-conduction control terminals (gates) of the FETs 14 are connected to a control circuit of the control circuit board 18, and so that a supply voltage to be applied to the input terminal 10 and respective source voltages of the FETs 14 are supplied to the control circuit. This control circuit controls the current conduction of each FET 14 on the basis of operation signals (such as switching signals, or the like) given from the outside through board terminals 16. Further, this control circuit detects a current flowing in each FET 14 on the basis of the potential difference between the supply voltage and the source voltage of the FET 14. This control circuit is configured so that, when the current exceeds an allowable limit, the FET 14 is turned off and a warning signal is outputted to a display device not shown through the board terminals 16.

A specific structure of the vehicle power distributor will be described below with reference to FIGS. 2 and 3, FIGS. 4A and 4B, and FIGS. 5A and 5B.

Figure 3:
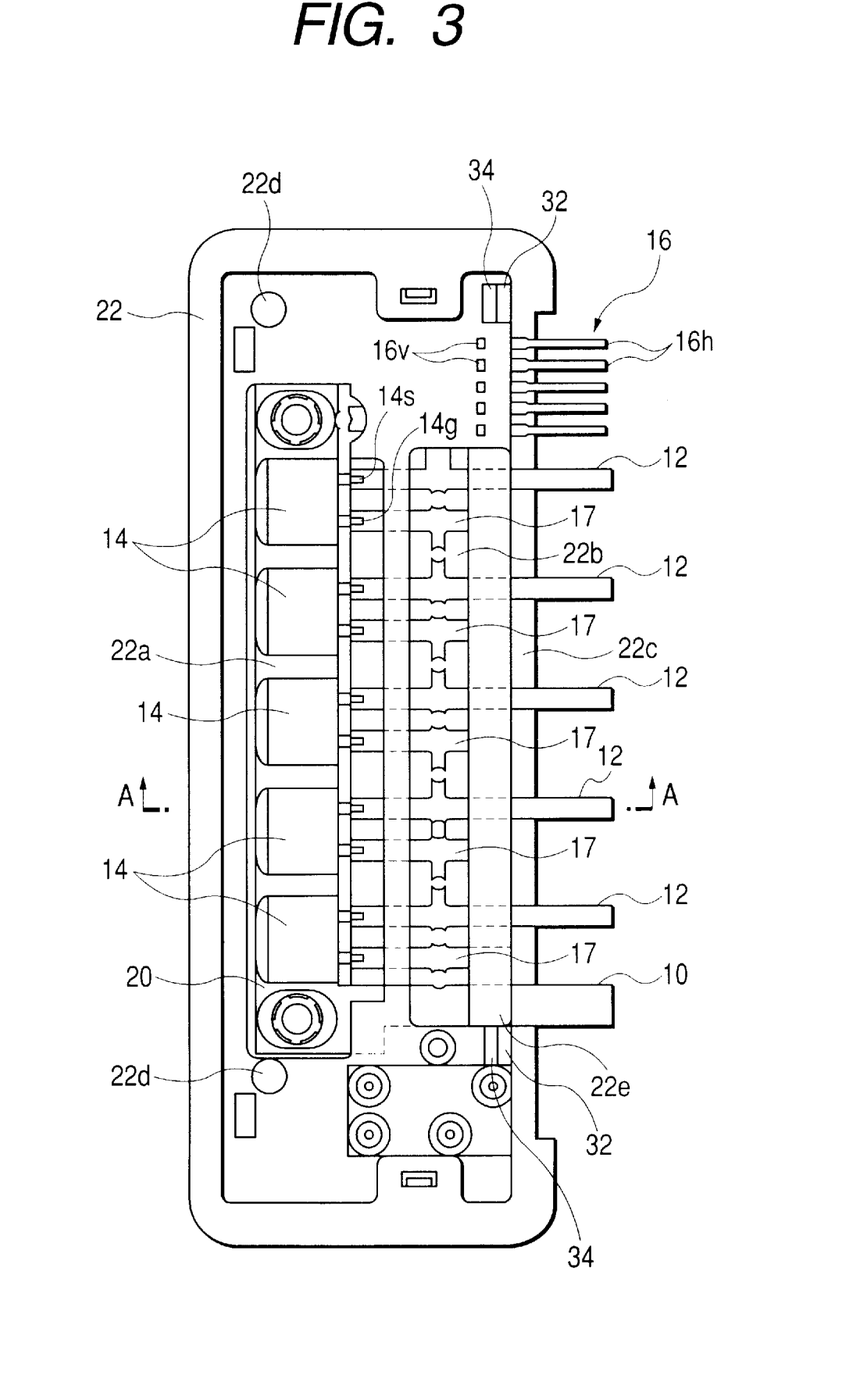
FIG. 3 is a plan view of the power distributor.

The input and output terminals 10 and 12, each of which is shaped like a strip of paper, are aligned so that all the terminals 10 and 12 protrude in one direction (rightward in FIG. 3). Each control terminal 17, which is similarly shaped like a strip of paper, is formed on one side of the corresponding output terminal 12. That is, the control terminals 17 and the output terminals 12 are arranged alternately as a terminal array and the input terminal 10 is arranged on the outside (lower side in FIG. 3) of the terminal array.

A drain connection plate 20, which extends in a direction of the arrangement of the terminals 10, 12 and 17, is disposed on the depthwise inside (left side in FIG. 3) of the terminals 10, 12 and 17. The drain connection plate 20 and the input terminal 10 are constituted by one metal plate. That is, the input terminal 10, the output terminals 12 and the control terminals 17 are arranged just on a side of the drain connection plate 20 so as to be along the direction of the length of the drain connection plate 20. The drain connection plate 20 and the input terminal 10 are integrally formed from one and the same metal plate. FETs 14 are arranged on the drain connection plate 20 so as to be along the direction of the length of the drain connection plate 20 (that is, along the direction of the arrangement of the terminals), and the FETs 14 are mounted on the drain connection plate 20.

Among terminals of the respective FETs 14, drain terminals, which are input side current-conduction terminals, are formed so as to be exposed to the back surfaces of chip bodies respectively whereas source terminals 14s, which are output side current-conduction terminals, and gate terminals 14g, which are current-conduction control terminals, protrude unidirectionally from side surfaces of the chip bodies respectively. The FETs 14 are aligned on the drain connection plate 20 in arrangement and pitch corresponding to those of the output terminals 12 and the control terminals 17. The FETs 14 are mounted on the drain connection plate 20 by welding or the like (for example, soldering) in the condition that drain terminals 14d of the FETs 14 directly touch the drain connection plate 20. The source terminals 14s and gate terminals 14g of the FETs 14 are electrically connected to rear ends of the output terminals 12 and control terminals 17 respectively by means such as soldering or the like.

The power distributor is produced by the following method. A master plate shaped so that the respective terminals 10, 12 and 17 and the drain connection plate 20 are connected to one another through narrow joint portions is punched out from one metal conductor plate. Then, a housing 22 is molded from an electrically insulating material (such as synthetic resin) so as to be disposed around the punched-out metal plate. Then, the joint portions are cut off.

As shown also in FIG. 3, the housing 22 has a window 22a for opening the drain connection plate 20 vertically, and a window 22b for opening intermediate portions of the output terminals 12 and control terminals 17 vertically. The housing 22 is configured so that the joint portions between the terminals are cut off through the windows 22a and 22b and that the respective FETs 14 can be mounted on the drain connection plate 20 by use of an upper space of the window 22a. The input terminal 10 and the output terminals 12 are led out upward along a front side wall 22c of the housing 22 and protruded out horizontally from an upper end of the side wall 22c toward the outside of the side wall 22c. The protruded portions of the terminals 10 and 12 are provided so that wiring members for on-vehicle loads are connected to the protruded portions through a bus bar board or directly.

A heat-radiation member mounting concave portion 23 is formed in a lower surface of the housing 22. A heat-radiation member 24 is attached to the concave portion 23. The heat-radiation member 24 is integrally formed from a high heat-conductive (or high specific-heat) material such as an aluminum alloy or a copper alloy. A large number of linear fins 24a which are parallel with one another are formed on a lower surface (a surface exposed to the outside of the power distribution portion) of the heat-radiation member 24. Opposite ends of the fins 24a are covered with fin-like ribs 23a formed on the housing 22 side.

A table portion 26 extending in a direction parallel with the direction of the arrangement of the FETs 14 is formed in the upper surface of the heat-radiation member 24 so as to be protruded upward. A back surface of the drain connection plate 20 is connected to an upper surface of the table portion 26 through a not shown electrically insulating sheet made of silicone or the like so that heat can be transmitted.

Incidentally, the conductor plates such as the terminals 10, 12 and 17 and the drain connection plate 20 need not be arranged on one and the same plane, that is, the conductor plates may be arranged on a plurality of stages different in level. The electrical insulator for holding the conductor plates and the housing may be formed separately. However, if the housing 22 is integrally molded around the conductor plates as shown in the drawings, reduction in total size of the power distributor and simplification in structure of the power distributor can be advanced more.

A plurality of board terminals 16 for connecting the control circuit board 18 to external circuits (provided on the outside of the power distributor) are arranged with a predetermined layout (in a lateral line in the drawings) on the side where the input terminal 10 and the output terminals 12 are provided. The plurality of board terminals 16 are molded so as to be integrated with the housing 22.

One end of each board terminal 16 serves as a board connection portion 16v which is disposed in the housing 22 so as to protrude upward. The other end of the board terminal 16 extends upward along the side wall 22c of the housing 22 and further protrudes out horizontally from the side wall 22c toward the outside in the same manner as in the input terminal 10 and the output terminals 12, so that an external circuit connection portion 16h is formed.

A configuration and a connecting method for connecting the control circuit board 18 to the power distributor will be described below.

The configuration of the control circuit board 18 per se will be described first. The control circuit board 18 is shaped substantially like a rectangle extending left and right in the same manner as the housing 22. A large number of through-holes 18h which pierce the control circuit board 18 in a direction of the thickness of the control circuit board 18 are provided in one end portion of one long side of the rectangle. The inner circumferential surface of each of the through-holes 18h is plated with a metal. The metal portions in the through-holes 18h are electrically connected to circuit portions of the control circuit board 18. The diameter of each of the through-holes 18h is set so that vertical portions 16v of the board terminals 16 are inserted through the through-holes 18h respectively while the vertical portions 16v come into electrical contact with the metal portions in the through holes 18h respectively.

A flexible wiring material 30 is electrically connected to a region of the aforementioned long side except the region in which the through-holes 18h are provided. The flexible wiring material 30 is provided in the form of a thin sheet. The flexible wiring material 30 extends in a direction parallel with the direction of the arrangement of the terminals (that is, in a direction along the long side) One of the long sides of the flexible wiring material 30 is fixed to a long side portion of the control circuit board 18 by soldering or the like and electrically connected to the control circuit. The other long side portion of the flexible wiring material 30 is fixed to the upper surfaces of the terminals 10, 12 and 17 by soldering or the like and electrically connected to the terminals. An inclined surface 22e for guiding the curved flexible wiring material 30 to the terminals 10, 12 and 17 smoothly is formed in a circumferential edge portion of the window 22b in the housing 22.

Incidentally, any material can be used as the flexible wiring material 30 if the material can execute electrical connection while deformed flexibly. For example, a flexible printed circuit (FPC) having a printed circuit incorporated in a thin electrically insulating sheet, or a flexible flat cable (FFC) having a plurality of rectangular conductors integrated with one another by an electrically insulating material while arranged flatly can be used preferably. A large number of electric wires may be used in accordance with the circuit configuration.

The power distributor further has a feature that a board support portion for supporting the control circuit board 18 in an erect state is provided near the conductor plates. Specifically, a pair of left and right ribs 32 are formed along the inner surface of the front side wall 22c of the housing 22. Support pieces (support members) 34 extend upward from the ribs 32 respectively so as to be parallel with the side wall 22c. Lock protrusions 34a are formed at upper ends of the support pieces 34 respectively so as to protrude from the upper ends toward the side wall 22c. All the ribs 32, support pieces 34 and lock protrusions 34a are molded so as to be integrated with the housing 22.

On the other hand, axial portions 18c protruded from the control circuit board 18 to opposite outer sides are provided at opposite ends of the long side of the control circuit board 18 to which the flexible wiring material 30 is connected. The thickness of each of the axial portions 18c (that is, the thickness of the board) is selected to be approximately equal to or slightly smaller than the distance of the space between each support piece 34 and the side wall 22c of the housing 22.

Incidentally, support post portions 22d for propping up the control circuit board 18 toppled over are provided on the bottom surface of the housing 22 so as to be erected. Lock pieces 36 (FIG. 5B) for locking the control circuit board 18 in the toppled position are provided on the bottom surface of the housing 22 so as to be erected. The lock pieces 36 are horizontally flexible. Protrusions 36a for locking the control circuit board 18 are formed at ends of the lock pieces 36 respectively.

A method of connecting the control circuit board 18 by using the aforementioned structure will be described below.

1) Temporary Support of Control Circuit Board 18

Figure 2:
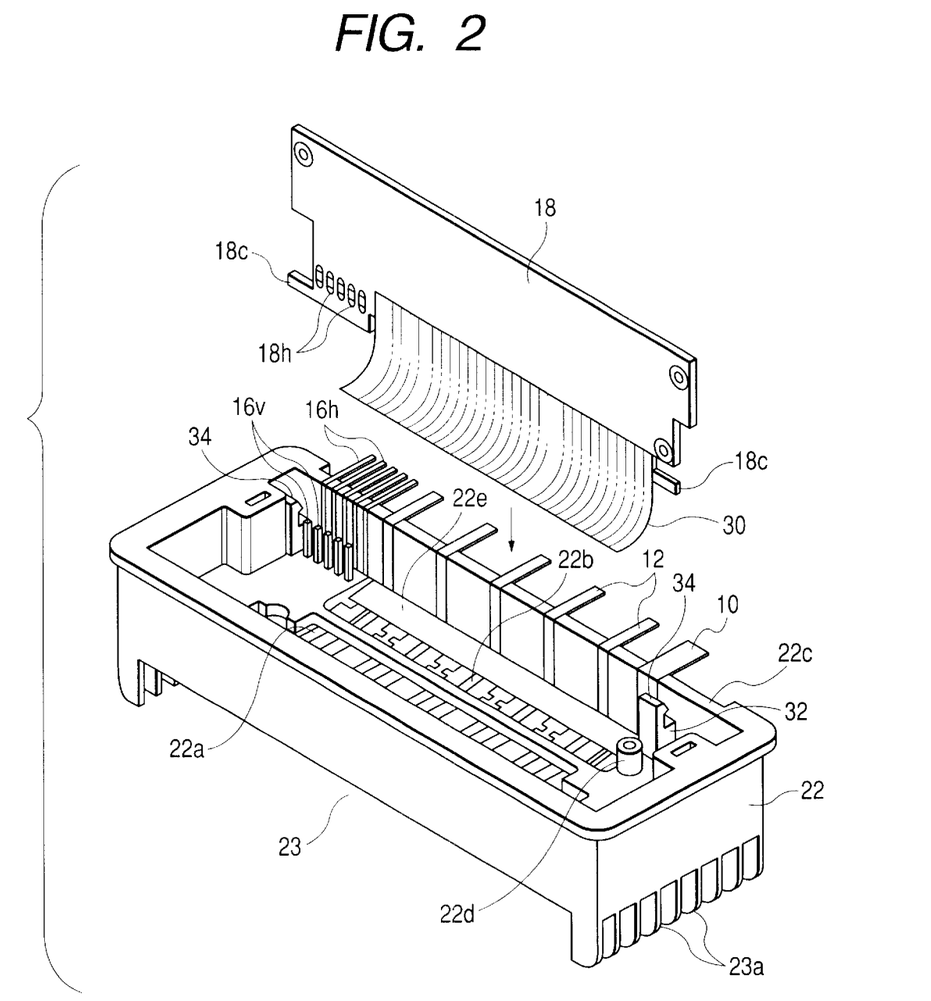
FIG. 2 is a perspective view showing the power distributor and a control circuit board connected to the power distributor.
Figure 4A:
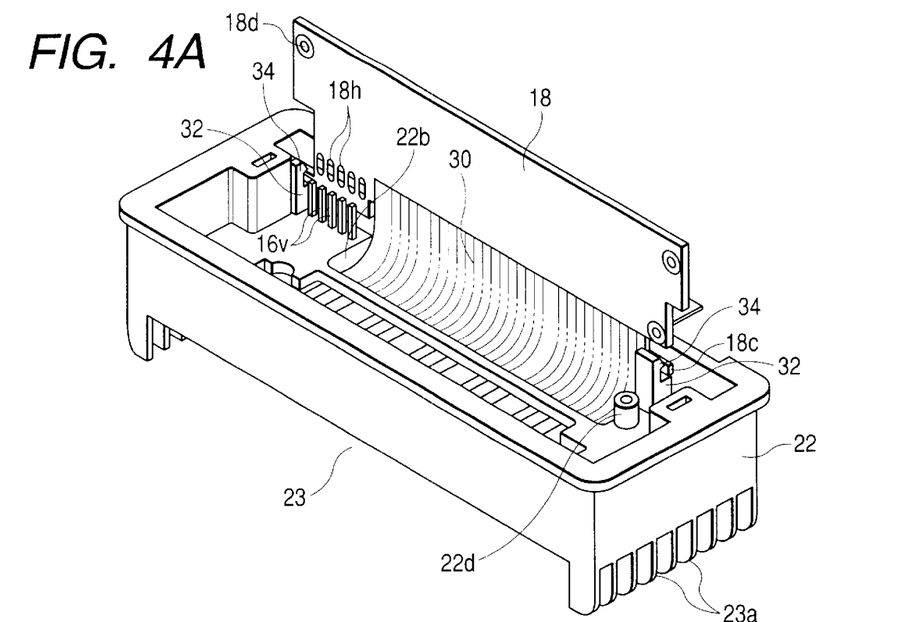
FIG. 4A is a perspective view showing a state in which the control circuit board is supported by a board support portion of the power distributor.
Figure 4B:
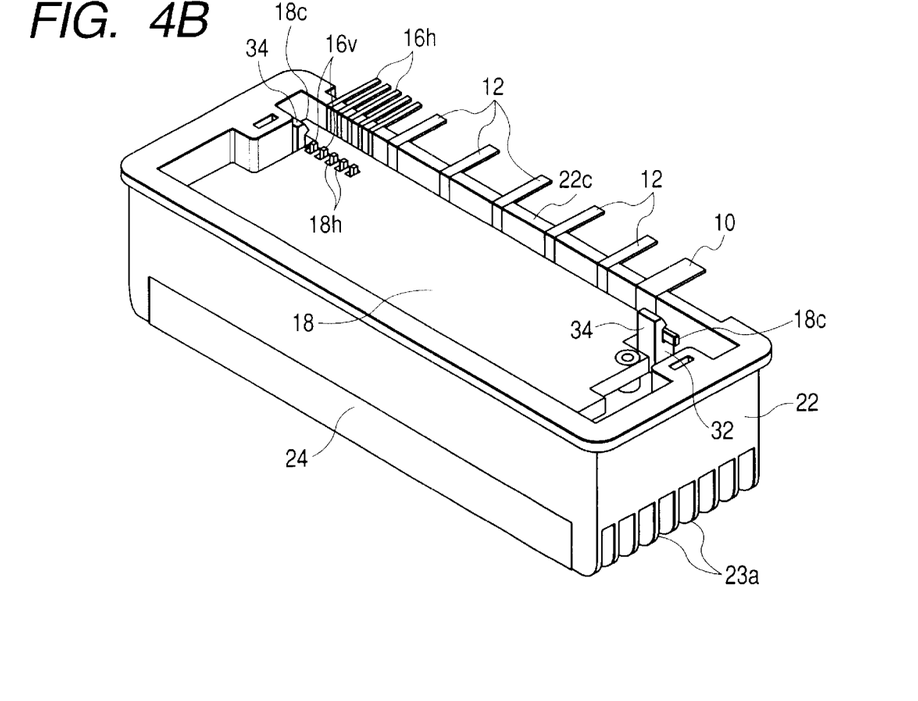
FIG. 4B is a perspective view showing a state in which the control circuit board is toppled over from the state shown in FIG. 4A.
Figure 5A:
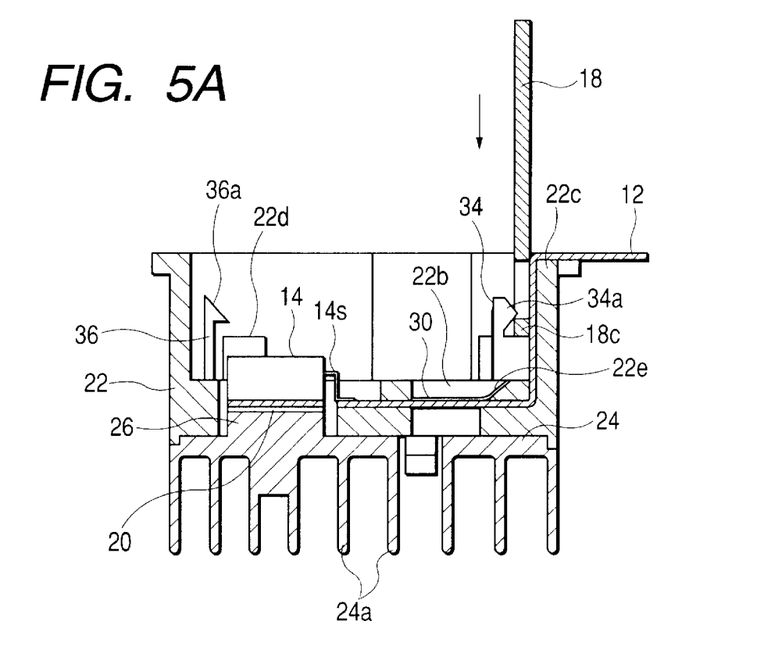
FIG. 5A is a sectional front view showing a state in which the control circuit board is supported by the board support portion of the power distributor.
Figure 5B:
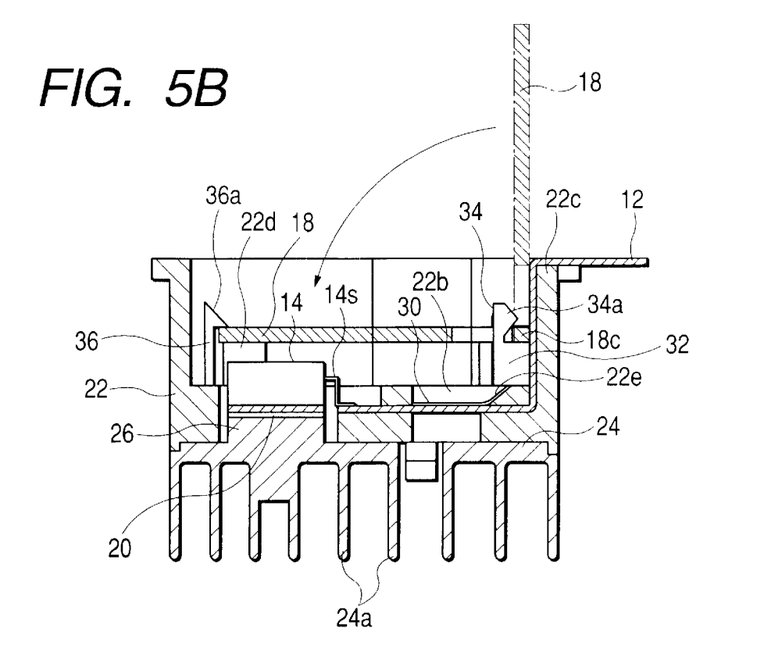
FIG. 5B is a sectional front view showing a state in which the control circuit board is toppled over from the state shown in FIG. 5A.

As shown in FIG. 2, while the long side of the control circuit board 18 where the through-holes 18h and the axial portions 18c are provided (that is, the long side of the control circuit board 18 to which the flexible wiring material 30 is connected) is turned downward and the axial portions 18c are forced into the spaces between the side wall 22c of the housing 22 and the lock protrusions 34a of the support pieces 34 respectively, the axial portions 18c are inserted from above into the spaces formed between the side wall 22c and the support pieces 34. Hence, as shown in FIGS. 4A and 5A, the control circuit board 18 is supported in an erect posture along the side wall 22c and the axial portions 18c are locked by the lock protrusions 34a respectively.

2) Connection of Flexible Wiring Material 30 to Respective Terminals

When the control circuit board 18 is supported in an erect state along the side wall 22c in the aforementioned manner, the lower end portion of the flexible wiring material 30 connected to the board 18 is guided by the inclined surface 22e of the housing 22 while the flexible wiring material 30 is curved near 90°. As a result, the flexible wiring board 30 is placed on the terminals 10, 12 and 17. In this condition, predetermined portions of the flexible wiring material 30 are electrically connected to the terminals 10, 12 and 17 by soldering or the like.

As described above, because the control circuit board 18 is supported in an erect state by the board support portion provided on the housing 22 side in advance, the difficult step of holding the control circuit board 18 accurately in a predetermined position by use of a robot, a jig, or the like, in the background-art manner becomes unnecessary. Hence, work is made extremely smooth.

3) Reception of Control Circuit Board 18

After the flexible wiring material 30 is connected to the terminals, the control circuit board 18 is rotated around the axial portions 18c while the axial portions 18c are supported by the board support portion. While the flexible wiring material 30 is further curved (approximately 180°), the control circuit board 18 is toppled over (FIGS. 4B and 5B) until the control circuit board 18 abuts on the support post portions 22d which are provided on the bottom surface of the housing 22 so as to protrude. On this occasion, the protrusions 36a of the lock pieces 36 lock the control circuit board 18 in a toppled position, so that the control circuit board 18 is received in the housing 22. On this occasion, the board connection portions 16v of the board terminals 16 are correspondingly inserted into the through-holes 18h provided in the control circuit board 18 and are connected to the through-holes 18h by soldering or the like.

In the power distributor having the control circuit board 18 connected thereto in the aforementioned manner, electric power given from an on-vehicle battery not shown is supplied to the input terminal 10 through an electric supply connection wire harness and distributed into the drain terminals 14d of the FETs 14. Electric power supplied to drain terminals 14d of ON-state FETs 14 among the drain terminals 14d of the FETs 14 is supplied to corresponding on-vehicle loads through corresponding output terminals 12 and a load connection wire harness.

On the other hand, an operation signal (such as a switching signal) sent from an external circuit is inputted to the control circuit of the control circuit board 18 through a board connection wire harness and corresponding one of the board terminals 16. In response to the operation signal, the control circuit supplies a control signal to the gate terminal 14g of each FET 14 through the flexible wiring material 30 and corresponding one of the control terminals 17 to thereby control ON-OFF switching of drain-source current conduction in the FET 14. When the FET 14 is switched off, electric supply to the output terminal 12 connected to the source terminal 14s of the FET 14 is cut off.

Further, the potential of the input terminal 10 and the potential of each output terminal 12 are supplied to the control circuit through the flexible wiring material 30. The control circuit calculates the value of a current flowing in each FET 14 on the basis of the potential difference between the input terminal 10 and the output terminal 12. When the current value is not smaller than a predetermined value, the control circuit performs controlling to cut off current conduction of the FET 14 forcedly.

In the present invention, however, it is regardless of the specific function or configuration of the control circuit incorporated in the control circuit board 18. Also the power distribution circuit constituted by conductor plates is not limited to the specific example shown in the drawings. For example, the power distribution circuit having the semiconductor switching devices such as FETs may be replaced by a power distribution circuit having relay switches incorporated therein. Alternatively, a general bus bar board having bus bar layers and electrically insulating layers laminated alternately may be used.

The present invention may take, for example, the following embodiment as another embodiment.

The posture of the control circuit board supported by the board support portion need not be a complete erect posture, that is, the control circuit board may be inclined more or less to the conductor plates. In short, the control circuit board may be inclined so long as the angle of inclination is kept to an extent that connection by the wiring material can be performed while the control circuit board is supported by the board support portion. Also the toppled position of the control circuit board need not be completely parallel with the conductor plates, that is, the control circuit board may be placed in any position so long as the control circuit board can be received well in the housing. As for the reception of the control circuit board, the control circuit board need not be received in the housing completely, that is, the control circuit board may be received in the housing to such a degree that there is no barrier in use.

Although the aforementioned embodiment has shown the case where the control circuit board 18 is held between the side wall 22c and the support pieces 34, the present invention can be applied also to the case where the control circuit board 18 is supported without using the side wall 22c. For example, a two-forked board support portion opened upward may be provided so that a lower end portion of the control circuit board can be embedded into the opening of the two-forked board support portion.

Although the aforementioned embodiment has shown the case where the control circuit board 18 can be rotated around the axial portions 18c while the axial portions 18c are supported by the board support portion, the present invention is not limited thereto. For example, the present invention can be applied also to the case where the control circuit board 18 may be once removed from the board support portion after completion of connection of the wiring material and then received in the housing again. In this case, particularly the control circuit board 18 need not be rotatably supported. For example, a groove for supporting the board may be formed in the housing so that the lower edge portion of the housing can be partially or wholly inserted into the groove downward.

The method described in the aforementioned embodiment has shown the case where the flexible wiring material 30 is connected only to the terminals 10, 12 and 17 in the condition that the flexible wiring material 30 is first connected to the control circuit board 18 side and then the control circuit board 18 is supported by the board support portion. However, the present invention can be applied also to the case where both connection of the flexible wiring material 30 to the control circuit board 18 and connection of the flexible wiring material 30 to the terminals 10, 12 and 17 are performed, for example, in the condition that the control circuit board 18 is supported by the board support portion.

Effect of the Invention

As described above, in accordance with the present invention, in order to connect a control circuit board to a power distribution circuit constituted by conductor plates, a board support portion for supporting the control circuit board in an erect state is provided in advance so that the control circuit board can be connected to the conductor plates in the condition that the control circuit board is supported by the board support portion. Hence, the complex step of positioning and holding the control circuit board accurately becomes unnecessary. There is an effect that the control circuit board can be electrically connected to the power distribution circuit by a simple step.

What is claimed is:

1. A vehicle power distributor comprising:
    a power distribution circuit constituted by conductor plates,
    a housing for receiving said power distribution circuit, said housing having a space secured for receiving a control circuit board connected to said power distribution circuit in a state in which said control circuit board is toppled over approximately in parallel with said conductor plates, and
    a board support portion for supporting said control circuit board in an erect posture with respect to said conductor plates provided near said conductor plates so that said control circuit board is connected to said conductor plates through a flexible wiring material in a condition that said control circuit board is supported by said board support portion.

2. The vehicle power distributor according to claim 1, wherein
    said housing is molded from an electrically insulating material around said conductor plates, and
    said board support portion is formed so as to be integrated with said housing.

3. The vehicle power distributor according to claim 1, wherein
    said board support portion has support members which are provided near a side wall of said housing so as to be erected; and
    an insertion space is formed between said side wall of said housing and each of said support members so that a lower end portion of said control circuit board in an erect state is inserted into the insertion space.

4. The vehicle power distributor according to claim 1, wherein
    said board support portion supports said control circuit board so that said control circuit board is rotatable between an erect position in which said control circuit board is erected with respect to said conductor plates and a toppled position in which said control circuit board is toppled over approximately in parallel with said conductor plates.

5. The vehicle power distributor according to claim 4, wherein
    said board support portion supports axial portions protruded at left and right ends of said lower end portion of said control circuit board so that said control circuit board is rotatable around said axial portions.

6. A method of connecting a control circuit board to a vehicle power distributor comprising a power distribution circuit constituted by conductor plates, and a housing for receiving said power distribution circuit, said housing having a space secured for receiving a control circuit board connected to said power distribution circuit in a state in which said control circuit board is toppled over approximately in parallel with said conductor plates,
    said method comprising the steps of:
        connecting said control circuit board to said conductor plates through a flexible wiring material in a state where said control circuit board is supported in an erect posture by a board support portion which is provided near said conductor plates for supporting said control circuit board in an erect posture with respect to said conductor plates; and
        toppling over said control circuit board to receive said control circuit board in said housing.

7. The method of connecting a control circuit board to a vehicle power distributor according to claim 6, further comprising the steps of:
    connecting said control circuit board to said conductor plates through a flexible wiring material in a state where said control circuit board is supported in an erect posture by a board support portion which is provided near said conductor plates for supporting said control circuit board so that said control circuit board can be rotated between an erect position in which said control circuit board is erected with respect to said conductor plates and a toppled position in which said control circuit board is toppled over approximately in parallel with said conductor plates; and
    toppling over said control circuit board in said toppled position while making said control circuit board supported by said board support portion to receive said control circuit board in said housing.

* * * * *